United States Patent
Nye et al.

(10) Patent No.: US 6,252,334 B1
(45) Date of Patent: Jun. 26, 2001

(54) DIGITAL CONTROL OF SMART STRUCTURES

(75) Inventors: Theodore W. Nye, Redondo Beach; Allen J. Bronowicki, Laguna Niguel; Richard E. Wyse, Rancho Palos Verdes; George R. Dvorsky, Manhatan Beach; Nicholas R. Steffen, Redondo Beach; Claude I. Kansaku, Chatsworth, all of CA (US)

(73) Assignee: TRW Inc., Redondo Beach, CA (US)

( * ) Notice: Subject to any disclaimer, the term of this patent is extended or adjusted under 35 U.S.C. 154(b) by 1366 days.

(21) Appl. No.: 08/541,799

(22) Filed: Oct. 10, 1995

Related U.S. Application Data

(63) Continuation of application No. 08/344,414, filed on Nov. 23, 1994, now abandoned, which is a continuation of application No. 08/007,644, filed on Jan. 21, 1993, now abandoned.

(51) Int. Cl.[7] .................................................. H01L 41/08
(52) U.S. Cl. ................... 310/328; 310/316.01; 310/317; 310/330; 310/326
(58) Field of Search .................................. 310/316, 317, 310/319, 326, 328, 330–332, 338, 339, 321, 323, 323.02, 316.01

(56) References Cited

U.S. PATENT DOCUMENTS

| | | | |
|---|---|---|---|
| 4,363,991 | * 12/1982 | Edelman | 310/316 |
| 4,565,940 | * 1/1986 | Hubbard, Jr. | 310/326 |
| 4,634,917 | * 1/1987 | Dvorsky et al. | 310/328 |
| 4,732,351 | * 3/1988 | Bird | 244/134 |
| 4,811,246 | * 3/1989 | Fitzgerald et al. | 310/328 X |
| 4,849,668 | 7/1989 | Crawley et al. | 310/328 |
| 4,868,447 | 9/1989 | Lee et al. | 310/328 |
| 4,869,768 | 9/1989 | Zola | 56/245 |
| 4,876,776 | 10/1989 | Whatmore et al. | 29/25.35 |
| 4,922,096 | 5/1990 | Brennan | 244/3.16 |
| 4,940,914 | * 7/1990 | Mizuno et al. | 310/326 |
| 4,958,100 | 9/1990 | Crawley et al. | 310/328 |
| 4,961,627 | 10/1990 | Swain et al. | 350/319 |
| 4,980,597 | * 12/1990 | Iwao | 310/319 |
| 5,013,955 | * 5/1991 | Hara et al. | 310/316 |

(List continued on next page.)

FOREIGN PATENT DOCUMENTS

| | | | |
|---|---|---|---|
| 0107686 | * 5/1987 | (JP) | 310/323 |
| 0303077 | * 12/1989 | (JP) | 310/323 |

OTHER PUBLICATIONS

R. L. Forward, "Electronic Damping of Orthogonal Bending Modes in a Cylindrical Mast—Experiment", *J. Spacecraft*, 18(1):11–17, Jan.–Feb. (1981).

E. F. Crawley and J. deLuis, "e of Piezoelectric Actuators as Elements of Intelligent Structures", *AIAA Journal*, 25(10):1373–1385 (1987).

E. F. Crawley et al., "Feasibility Analysis of Piezoelectric Devices", Sponsored by McDonnell Douglas Astronautics Company, SSL 5–88, Jan., 1988.

B. A. Ward and E. F. Crawley, "A Hierarchical Control Architecture for Large Flexible Structures", Space Systems Lab, MIT–SSL #18–85.

Primary Examiner—Mark O. Budd
(74) Attorney, Agent, or Firm—Michael S. Yatsko

(57) ABSTRACT

Modular control patches including assemblies of sensors and actuators are provided to impart or control vibration of foundation members such as struts in aerospace apparatus. Local digital electronic control means is associated with each control patch assembly. Programmable digital compensators in the control permits operation of the patches to be remotely varied. Patches are attached mechanically or by chemical bonding to the outside of the struts so that the electronics can be selectively removed and replaced. The patch being the sensors and actuators may also be attached or embedded with a composite structure.

38 Claims, 10 Drawing Sheets

U.S. PATENT DOCUMENTS

| | | | |
|---|---|---|---|
| 5,016,333 | 5/1991 | Payne et al. | 350/319 |
| 5,022,272 | 6/1991 | Bronowicki et al. | 73/722 |
| 5,030,490 | 7/1991 | Bronowicki et al. | 428/36.4 |
| 5,081,391 | 1/1992 | Owen | 310/334 |
| 5,126,615 | 6/1992 | Takeuchi et al. | 310/330 |
| 5,129,132 | 7/1992 | Zdeblick et al. | 310/328 X |
| 5,348,287 * | 9/1994 | Yamamoto et al. | 310/323 |
| 5,374,011 * | 12/1994 | Lazarus et al. | 310/328 X |
| 5,424,596 * | 6/1995 | Mendenhall et al. | 310/328 |
| 5,440,193 * | 8/1995 | Barrett | 310/328 |
| 5,525,853 * | 6/1996 | Nye et al. | 310/316 |

* cited by examiner

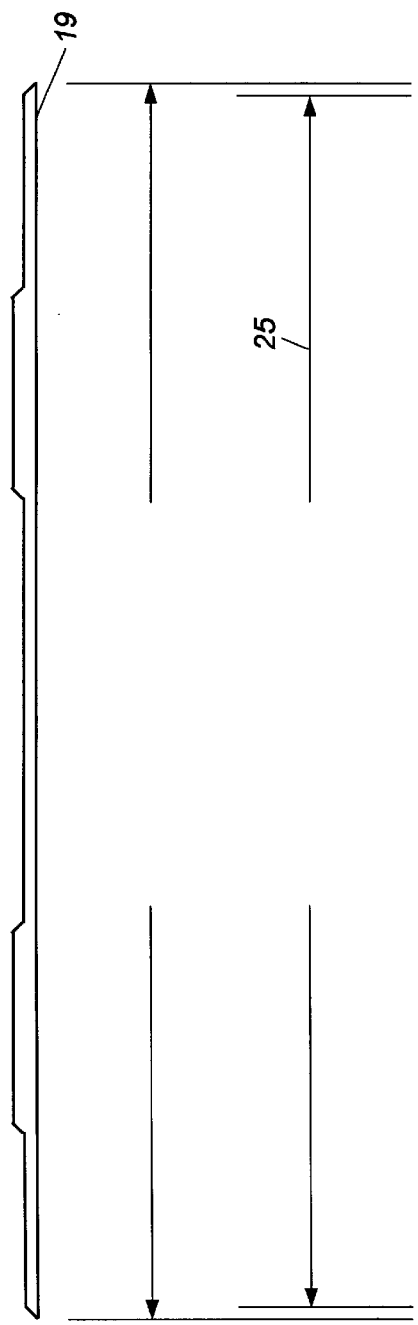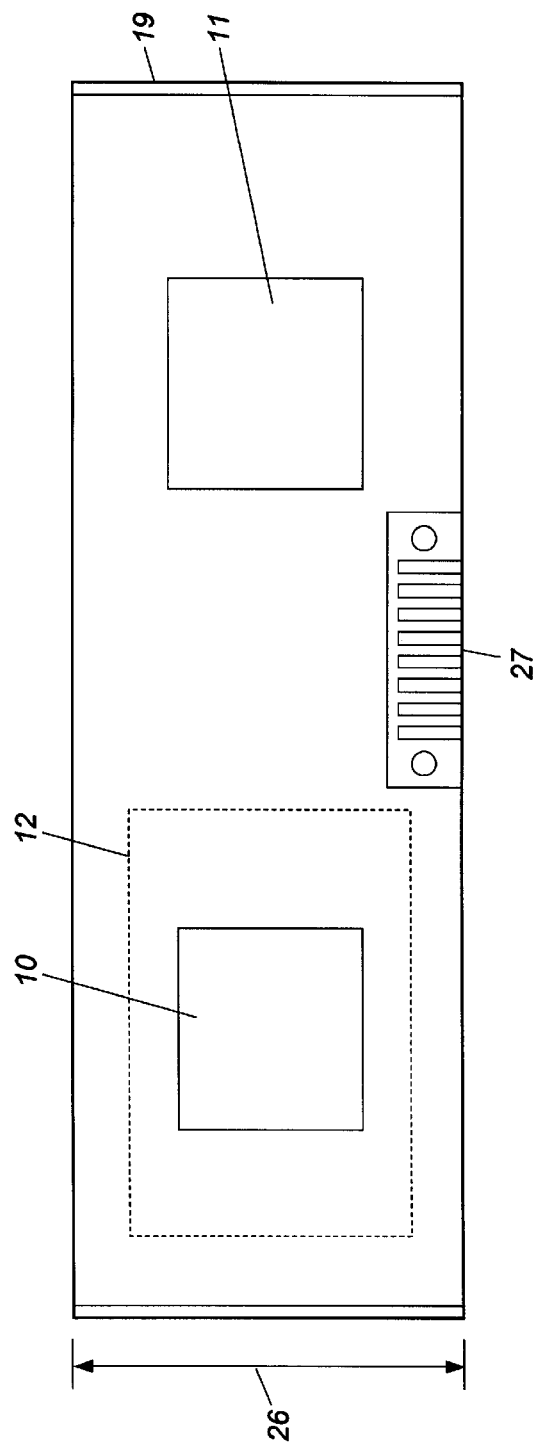

DIGITAL CONTROL OF SMART STRUCTURES

RELATED APPLICATION

This application is a continuation of application Ser. No. 08/344,414, filed Nov. 23, 1994 now abandoned, which is a continuation of application Ser. No. 08/007,644, filed Jan. 21, 1993 now abandoned.

This application relates to U.S. Ser. No. 08/007,298 entitled "Smart Structures for Vibration Suppression" filed contemporaneously with the present application. The contents of that application are incorporated by reference herein.

This invention was made with Government support under Contract No. F33615-90-C-3200 awarded by the U.S. Air Force. The Government has certain rights in this invention.

BACKGROUND

Being able to accurately determine and control the movement of structures, particularly in aerospace is increasingly important. Being able to easily program and vary the degree of control and movement is particularly valuable.

This invention relates to vibration, alignment control, and health monitoring of foundation members and surfaces. In one particular aspect, the invention relates to the control of such members in aerospace applications such as the control of struts in spacecraft. The invention also has particular application in the static control of foundation members and the control of deformity of structures, for instance in aircraft and automobiles.

Space missions during the next decade will require lightweight, cost effective, high performance material systems which can achieve enhanced satellite pointing capabilities. These material systems will employ smart structure technologies. This includes active damping, passive damping, and leveraging advanced metallic and plastic composites to shape and tailor mechanical behavior.

Also, there is a need to reduce noise and vibration in vehicles, for instance, to improve comfort for passengers. By being able to alternate vibration, the structure borne sound in cars, trucks, and other passenger vehicles can be reduced.

Smart Structure Technology

Vibration control and suppression includes use of an active technology. This approach uses materials with properties that can be altered with externally applied signals. These materials are sometimes referred to as smart materials. Smart materials include wafers of piezoelectric elements such as ceramics, for example, lead-zirconate titanate ("PZT") elements. These elements are embedded into advanced composite structural foundation members composed primarily of graphite fibers with several kinds of matrix systems—epoxies, polycyanates, and thermoplastics. The members thereby become smart structures.

By applying an electric field, $\epsilon$ across the PZT wafer thickness, a strain, $\in$ is induced into the structural member. The relationship of strain to electric field is defined as the piezoelectric strain to electric field coefficient, $d_{31}$ and is defined as $\in = d_{31}\epsilon$. This determines the efficiency in the evaluation of PZT. The strain constant together with the PZT material modulus of elasticity, E, measures the lateral stress, $\sigma$, generated per unit field and is an indicator of the actuation force on the smart structure. This can be expressed as $\sigma = E\in$ or $\sigma = Ed_{31}\epsilon$.

Vibration damping requires a direct method to sense strain. Piezoceramics have a high strain sensitivity. For precision spacecraft applications where nano-strains must be measured, the viable choice is PZTs. Sensing micro-strains with PZTs requires measurement of milli-volts, which is relatively easy. PZTs are also favored for environmental factors such as insensitivity to temperature. Piezoelectric sensors enjoy the further advantage that they are self-generating, producing a signal directly from strain. This makes them more power efficient, and drift is less significant.

Vibration and shape control may be achieved with a number of actuators. The specific requirements of space and vehicle vibrations make PZTs the preferred choice. Most piezoceramics produce a similar blocked force per unit field, about 0.56 lb/V-in. At maximum working field, roughly 2,000 psi of applied stress deforms a graphite layup about 50 micro-strains. This is sufficient for almost all bending vibration control applications, and some shape control requirements. Linearity of actuation is also excellent. In previous research, it has been shown that embedding PZTs in graphite virtually eliminates hysteresis due to creep. Similar to PZT sensors, actuation strength over a wide temperature range was also shown to be very uniform.

Various assemblies built for structural applications contain unacceptably low levels of damping. These structures could benefit immensely from the addition of active damping. One drawback is that the structure may already be manufactured and assembled before the need for additional damping is identified. Metallic structures that require active damping are one example.

There is a need for a discrete piezoelectric sensor/actuator assembly that can be bonded in, on or mechanically attached to a foundation member.

Throughout the evolution of smart structures using piezoelectric elements, control electronics have been a major implementation problem. Their inherent size, weight, interface cabling needs, and environment requirements have been a substantial application roadblock.

Also it has not been possible to provide for easy adjustment of the control of the smart structure after setting up and deployment of the structure.

There is a need for miniature, discrete electronic controllers which can be adjusted in operation for use with piezoelectric elements.

SUMMARY

The invention seeks to fulfill the needs of smart structures.

According to the invention, there is provided a modular assembly control member, namely a patch, as a preformed assembly of encapsulated piezoelectric sensors and actuators. The patch may be embedded in a foundation member device during structure fabrication as it may be or it can be bonded on to an existing foundation member. A smart structure is thereby obtained.

Local digitally-based control electronics for the assembly is attached through a button board interface to the assembly in either an axial or transverse arrangement relative to the actuator and scissor in the assembly. Other electrical connecting methods between the local control electronics and the patch may be used.

One local electronic controller is designed to slave to one sensor/actuator assembly as a single input, single output system. Thus, n-controllers are required for an n-assembly strut system.

The electronics applied locally to the assembly is fed by a serial electrical interface, laced throughout the structure to a central control. The local electronic control for each assembly eliminates large control wire harnesses, eliminates sensor noise contamination, and reduces electronic signal lag (limiting bandwidth). The local control electronics is digitally based and allows for programmable independent operation by each local controller for maximized system reliability and simplicity.

The patch effects active damping of the foundation member by detecting local strains in the foundation member. Strain detection by the patch is effected with one or more piezoelectric sensors in the patch. Strain actuation is done with a piezoelectric actuator in the patch. The sensors can be colocated with the actuator, or nearly colocated with the actuator.

The control electronics includes three basic components to provide electronic digitally based control signals into a smart structure. The first part, or input stage, uses analog charge amplifiers that convert piezoelectric (PZT) charge to a voltage appropriate for a digital compensator. The second stage, a digital compensator, processes the signal with gains and phase shifts to dampen or cancel vibrations in the foundation member.

The digital compensator is responsive to variable operation by remotely generated signals. As such, the digital compensator is programmable, and the smart strut can be set up to be variably responsive according to the requirements determined remotely from the strut. The digital compensator can be varied in its operation. The digital compensator stage generates a digital feedback signal for the purpose of controlling the foundation member. This signal is then fed into the third part, or analog drive amplifier stage, which drives the PZT actuators. The drive amplifier is a linear voltage amplifier device with phase compensation to enhance stability when driving PZT devices at high frequencies.

The invention addresses active damping, shape control and health monitoring control electronics using digital compensators.

The invention is now further described with reference to the accompanying drawings.

DRAWINGS

FIG. 4a is a side view of a control patch unit.

FIG. 4b is a top plan view of a control patch unit.

DESCRIPTION

Figure 1A:
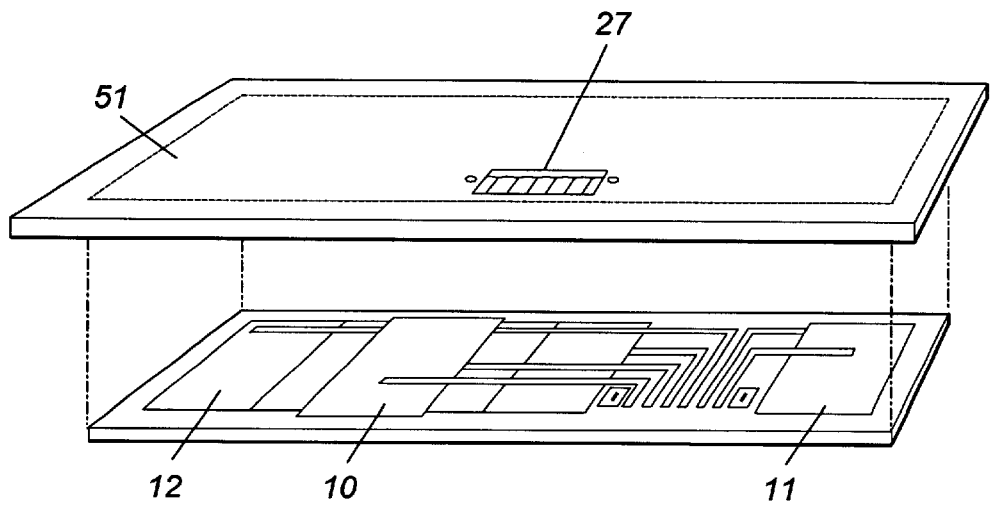
FIG. 1a is an exploded view of a first embodiment of a structural control patch construction unit.
Figure 1B:
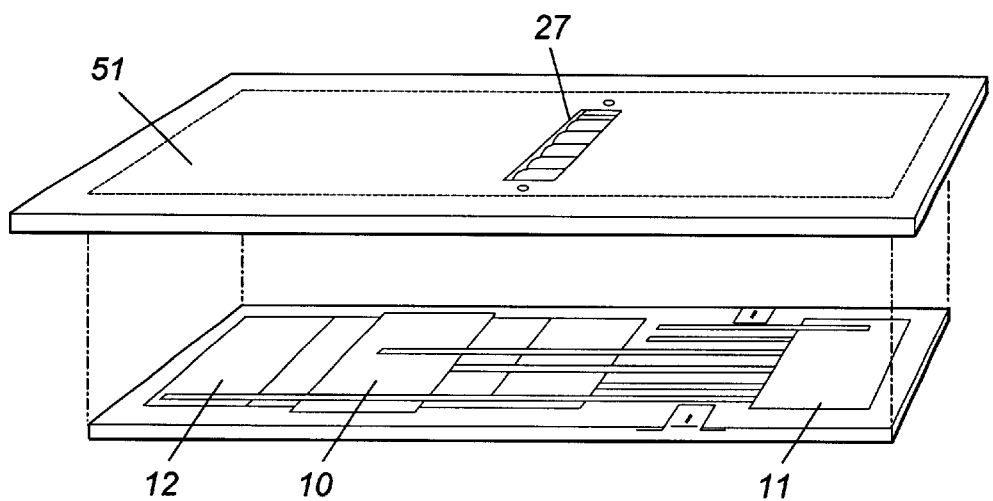
FIG. 1b is an exploded view of a second embodiment of a structural control patch construction unit.
Figure 2:
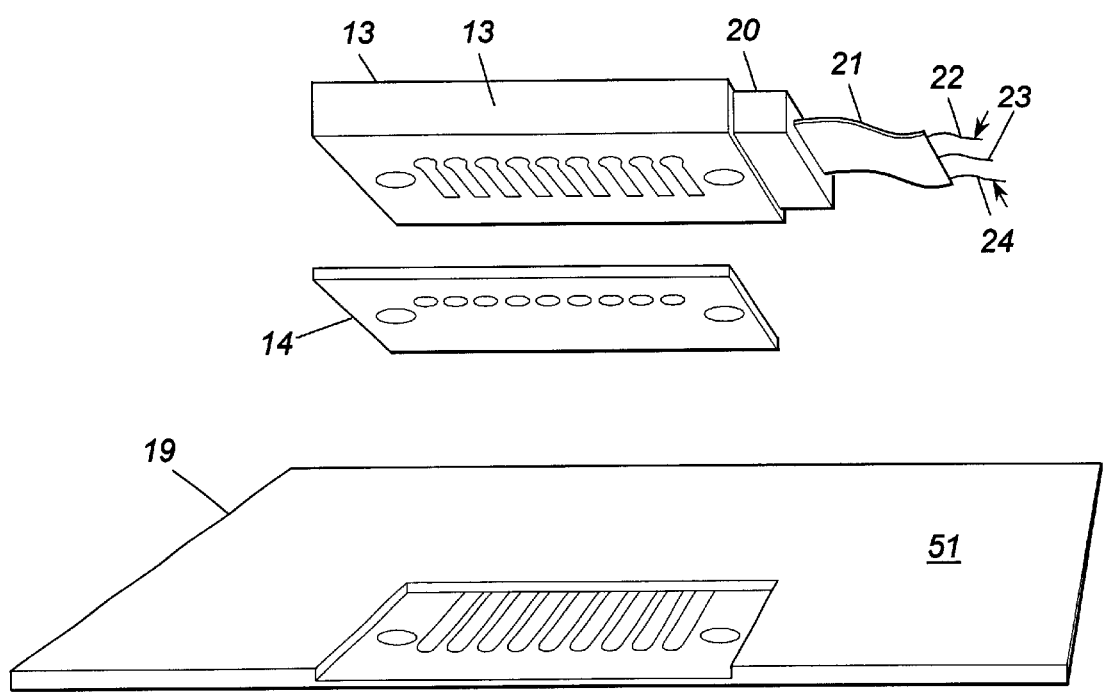
FIG. 2 is an exploded view of the electrical connections to the structural control patch unit.

A modular control patch assembly 19 for controlling strain in a foundation member is pre-formed as a unit assembly of encapsulated piezoelectric ("PZT") sensors 10 and 11 and actuators 12 as illustrated in FIGS. 1a and 1b. Digital control electronics 13 are attached by a button board interface 14 as shown in FIG. 2. In FIG. 1a the interface 14 is located axially, and in FIG. 1b the interface is transversely located.

Figure 3:
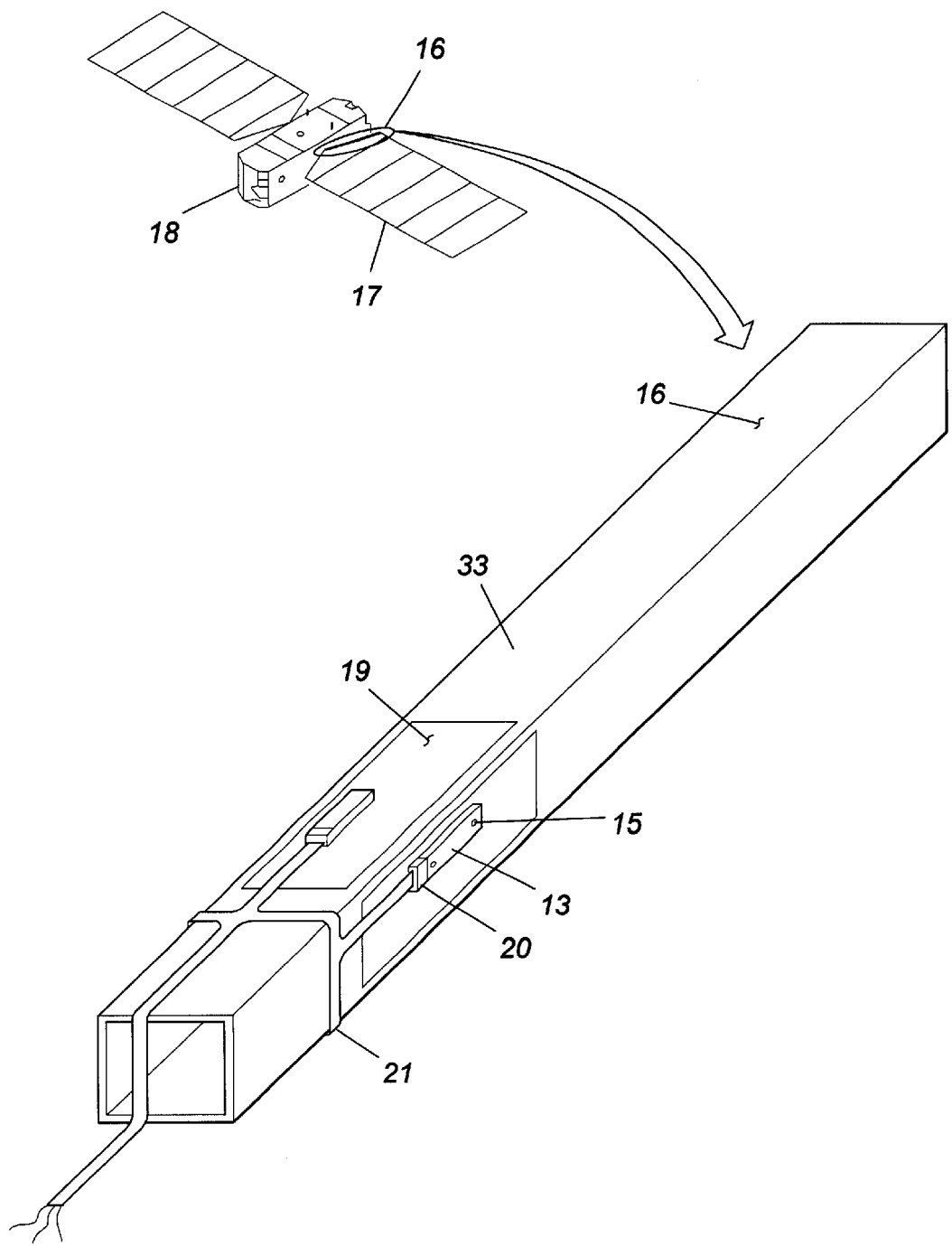
FIG. 3 is a perspective view showing modular control patches retrofitted to an existing spacecraft strut forming a foundation member thereby creating a smart structure.

As illustrated in FIG. 3, the control electronics 13 can be attached during construction or by retrofit to a foundation member 33 with an axially displaced mechanical fastening means 15. FIG. 3 illustrates an existing metallical or composite spacecraft strut 16 as the foundation member 33 supporting a solar array 17 in a spacecraft 18. The retrofit module control patch units with embedded piezoelectric sensors and actuators are bonded to the foundation member 33 of the strut 16.

Mechanical fasteners 15 attach the digital control electronics 13 to the modular control patch assemblies 19. The digital control electronics 13 is modular and is applied locally to each control patch assembly 19. There is a micro-miniature interface connector 20 with the local electronics 13 and a central electronic control remotely located from the assembly 19. From the connector 20 there is a flat ribbon flex harness 21 connecting the local electronics 13 of the modular control patch unit 19 with the external remote electronics which may be a main computer on the spacecraft 18 or a power source on the spacecraft 18. Such a system can provide unregulated power lines 22 and 23 and a serial input/output interface line 24 for central command communication between the central electronic control and the local remote control electronics 13.

Mechanical connections of the local digital control electronics 13 to the control patch assembly 19 is effected by the button board interface 14 as shown in FIG. 2. This attachment method allows for a strain forgiving electrical interface to the structural member. The button board interface connector 14 is described under U.S. Pat. No. 4,581,679, the contents of which are incorporated by reference herein. Other electrical connecting methods between the digital control electronics 13 and the assembly 19 may be used.

Control Member Assembly

The modular control patch assembly 19 as illustrated in FIGS. 4a and 4b is a relatively thin element which is about 6" in length 25 and about 2" in width 26. The height is about 0.125". The control patch 19 includes at least one PZT sensor 10 with at least one PZT actuator 12, both mounted in back-to-back electrical polarity relationship. The PZT sensor may be colocated sensor 10 with the actuator. Also located as part of the patch 19 is a nearly-colocated PZT sensor 11 which is mounted transversely relative to the colocated sensor 10. Both colocated sensors 10 and nearly-colocated sensors 11 may be used. The actuator 12 measures about 0.0075"×1.5"×2.5" in size. The sensors 10 and 11 measure about 0.0075"×1"×1" in size. There is a cut out implant 27 in a graphite overwrap 28 for the interface button board 14. The cut out 27 measures about 0.536"×1.5" wide for each control patch unit.

Figure 9:
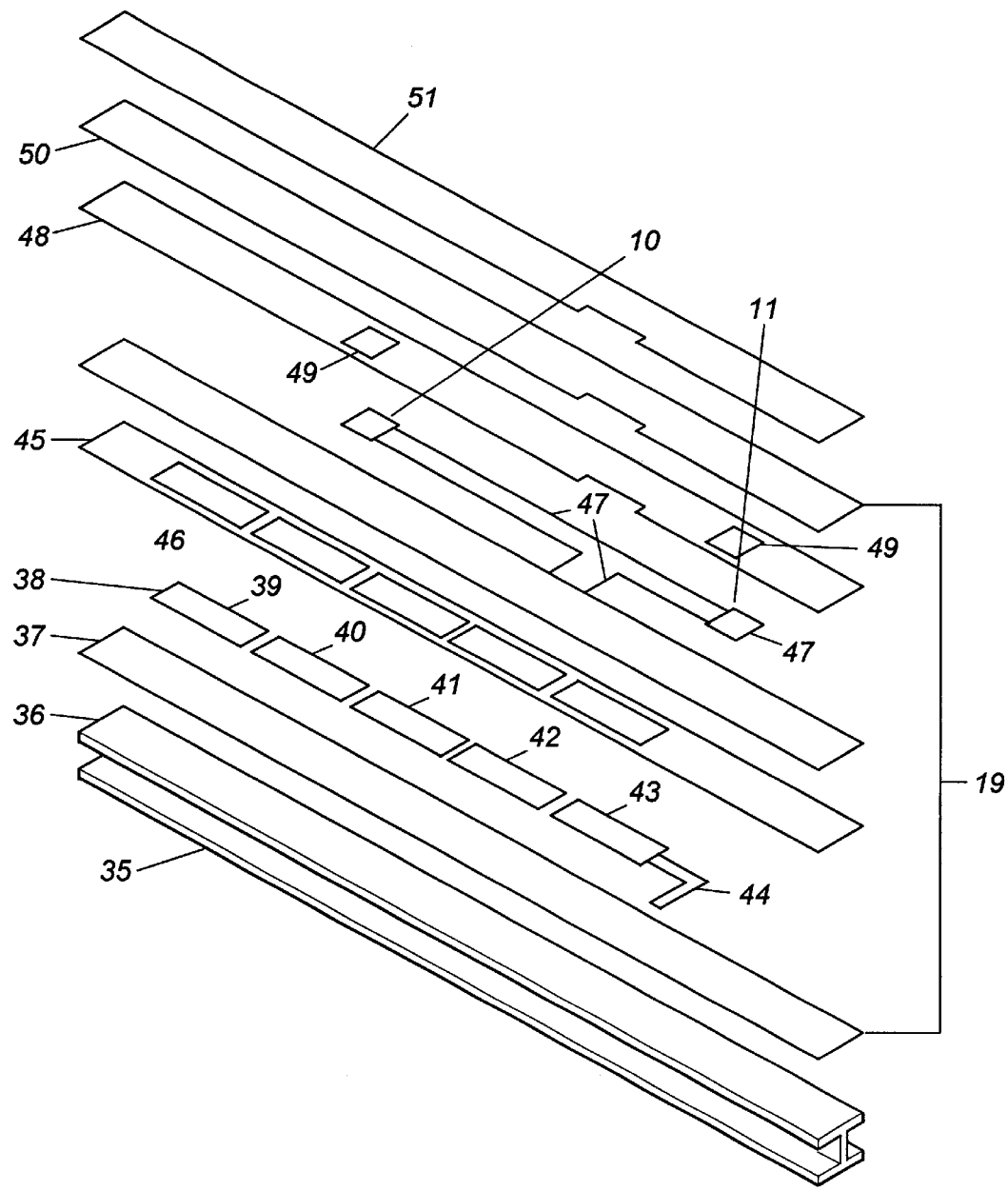
FIG. 9 is an exploded perspective view of a smart strut illustrating the relationship of an I-beam foundation member with the components and encapsulating layers of the patch unit, and an overtape.

A layout of a typical smart strut is shown applied to an I-beam foundation member in FIG. 9.

The smart strut as illustrated in FIG. 9 is a graphite I-beam 35 with a surface 36 acting as the foundation member 33 (FIG. 3). The unit 19 is constituted by a base formed by an encapsulated material 37. Above that material 37 there is an actuator string 38 having actuators 39, 40, 41, 42, and 43 with output line connectors 44. Above the actuator string 38, there is an encapsulation material 45 through which there are spaces 46 for the actuators 39–43 to be relatively exposed. Above the encapsulated material 45 there is a colocated sensor 10 and a nearly-colocated sensor 11 which are spaced apart and connected electronically as indicated by lines 47. Encapsulating material 48 with windows 49 and a further encapsulating layer 50 are located over the sensors 10 and 11. Finally, the unit 19 is over-wrapped with a graphite tape overwrap 51 located over the encapsulating material 50.

Control Electronics

The basic components of the digital control electronics 13 for the patch 19 includes a pair of sensor charge amplifiers 29 and 30. The sensor charge amp circuit 29 is connected to receive signals from the sensor 10, and the charge amp circuit 30 is connected to receive signals from the sensor 11. The outputs of these amplifiers 29 and 30 are directed to a summer 31 which is connected for feeding a digital compensator 32. The procedure of averaging two sensor signals to achieve a desired dynamic characteristic is described in U.S. Pat. No. 5,022,272 entitled "Locally Compensated Deformation Sensor." The output from the first stage, namely from amplifiers 29 and 30 converts the PZT charge from the sensors 10 and 11 to voltages appropriate for the digital compensator 32. The digital compensator 32 processes the signal with an appropriate gain and phase shift and cancels vibrations in the foundation member 33. The digital compensator 32 is digital microprocessor device. The output of the digital compensator 32 is directed to a drive amplifier 34 which, in turn, outputs a signal to the PZT actuator 12. The drive amplifier 34 is a linear voltage amplifier device with phase compensation to enhance stability when driving PZT devices at high frequencies.

Figure 5:
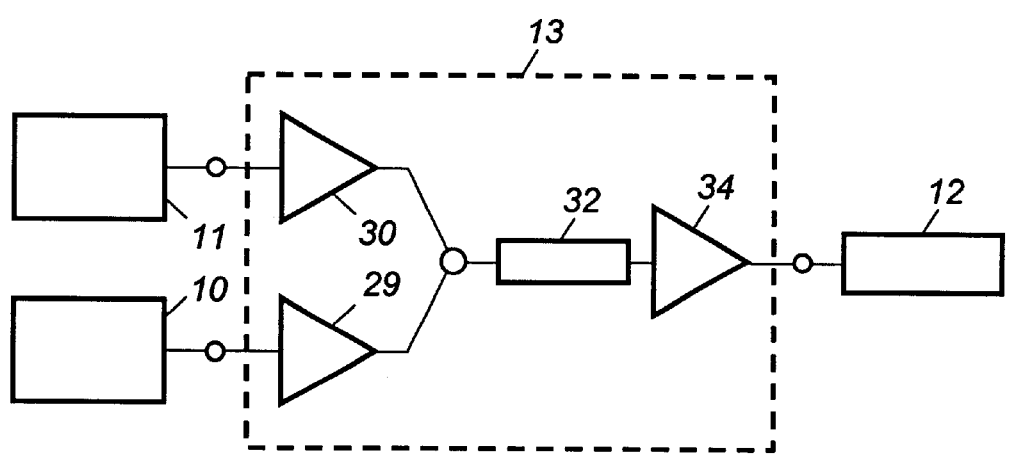
FIG. 5 is a schematic illustrating the basic components of the control electronics for a structural control patch unit.
Figure 6:
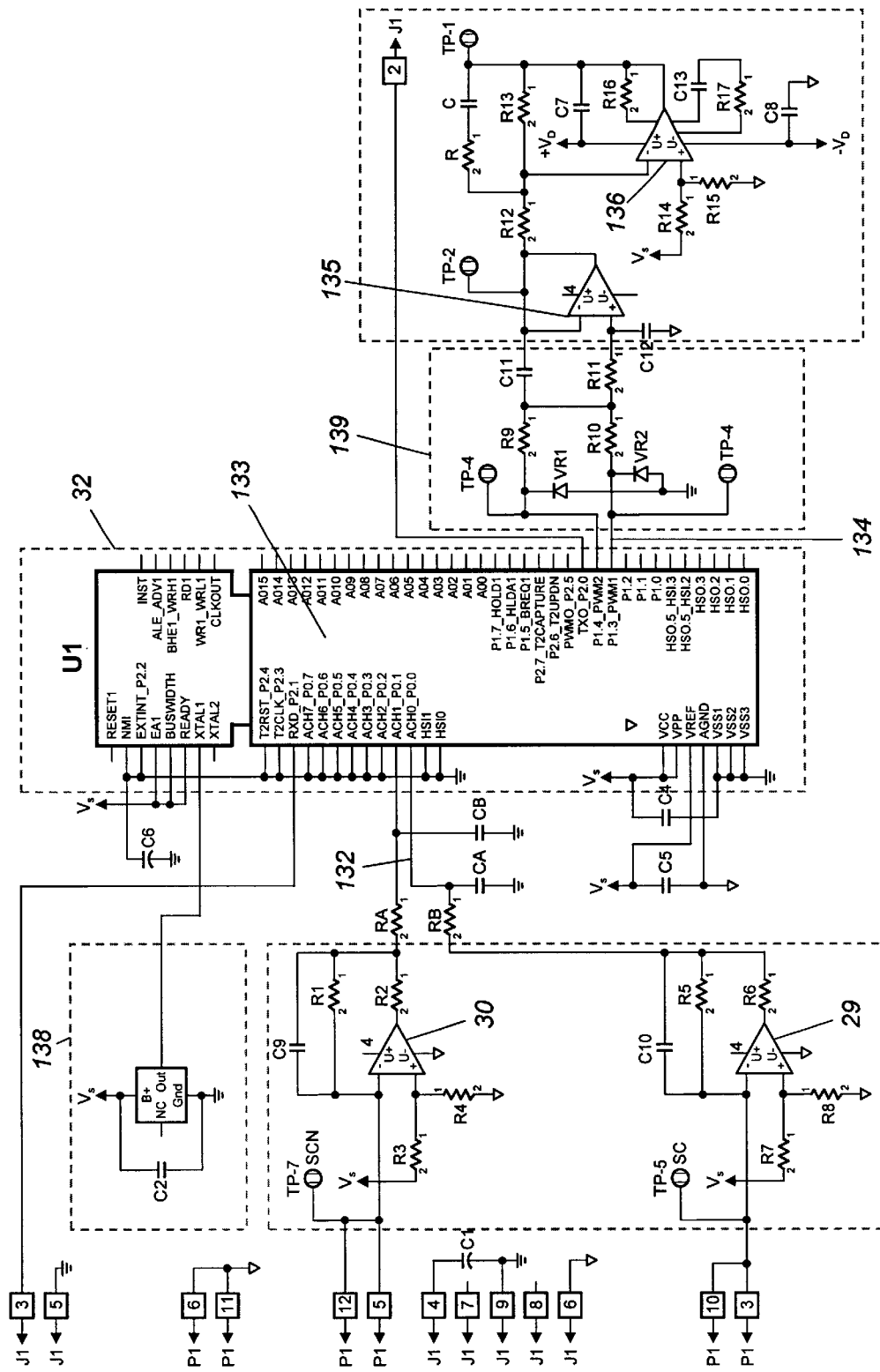
FIG. 6 is a schematic illustrating an embodiment of the digital control electronics.

There are several possible versions of digital compensators 32. All of these operate with the modular control patch 19. A schematic of one of these controls is shown in FIG. 6. The design employs the basic features of the digital control electronics 13 depicted in FIG. 5. The control provides active damping to the foundation member 33 thereby creating a smart strut.

Active damping is implemented by enforcing a 90° phase lag to the structural system, measured from the PZT sensors 10 and 11 and applied by the PZT actuator 12. FIG. 5 shows a simple schematic of the electronic architecture designed to accomplish this task. The input stage of charge amplifiers 29 and 30 supplies the appropriate gain and filtering for the digital compensator 32. The digital compensator 32 in turn, implements a control law or electronic filter, which creates the phase shift to which the foundation 33 will damp in response. The signal is then fed into a third stage drive amplifier 34, which again filters and boosts the phase lagged signal to directly drive the PZT actuators 12. One controller 13 is designed to slave to one foundation member 33 strut as a single-input, single-output system. Thus, for a strut system using n-control patches 19, there are n-controllers 13.

General Architecture of Active Damping, Control Electronics

Active damping includes an arrangement and use of actuators 12, colocated sensors 10 and nearly-colocated sensors 11. Colocated sensors 10 are placed approximately centrally and located axially as the actuators 12. A colocated sensor 10 produces structural transfer functions with alternating poles and zeros, resulting in no relative phase difference between modes. Nearly colocated sensors 11 are desirable since they are used to generate arbitrary zero locations in the structural transfer function. These nearly-colocated sensors 11 are appropriately averaged with the colocated sensors 10 to set relative phasing between structural modes. This optimizes the performance of certain control algorithms (i.e., allows a single feedback loop to damp multiple modes).

There are several advantages to the local controller electronics 13 approach. Each active strut 16 with embedded sensors 10, 11 and actuators 12 requires a minimum of six (or a maximum of twelve) shielded analog wires. Encapsulation of the PZT sensors and actuators and the sensor cables in conductive graphite-epoxy layers results in a "Faraday cage" effect which protects low level sensor signals from electromechanical interference and spacecraft charging.

The control components of patch 19 and digital control electronics 13 are assembled onto a small printed circuit board. Power required for one controller 13 was approximately 1 watt while idle, and 5 watts while damping the foundation member 33 (depending on strut disturbance displacements). Voltages required are 15 volts for the charge amps 29 and 33, +/−60 volts for the drive amp 34, and 5 volts for the digital compensator 32. The electronics board measures approximately 0.6"×2.5"×4.0".

With local digital control electronics 13, namely distributed microcontroller electronics 13 with each unit 19 connected to a single, serially connected, power supply cable 21, there is created a simple, minimum integration-effort design. Contrarily with the prior art technique of combining a few smart struts onto a spacecraft and interfacing them to a central global controller results in a bulky harness that makes active damping prohibitive.

Control Electronics Components

Three key components comprise the local active damping control electronics. These components, or stages, are shown in FIG. 5.

The first component consists of the charge amplifiers 29 and 30, whose purpose is to convert charge generated by the piezoelectric sensor elements 10 and 11 to voltage. One charge amplifier 29 or 30 is generally used for each piezoelectric sensor although there are situations where two or more sensor charges are summed prior to the charge amplifier and only one amplifier is used. Charge amplifiers are available from various suppliers and in a variety of packages. Commercially available versions charge amplifiers are of the Linear Technology LT1012 (Trademark), NSC-LM660 (Trademark), and Burr-Brown OPA 111 (Trademark).

Voltages exiting from the charges amplifiers are generally summed together with a summing amplifier, may be filtered to remove high frequency noise, and are then fed into the compensator 32.

The second key component is the digital compensator 32. The digital compensator 32 introduces a 90° phase lag into the electrical signal at mechanical resonance of the controlled structure. It is this signal that effects damping in the foundation member and creates the smart structure. The digital compensator 32 can be regarded as a filter (or series of filters) to create the phase shift over structural resonance points of interest. Commercially available versions of the digital compensators are the Intel 806196KC (Trademark)

microprocessor chip, the Texas Instruments TMS320 (Trademark) microprocessor chip and the Motorola 5W56 (Trademark) microprocessor chip.

The last key component of the control electronics 13 is the drive amplifier 34. It converts the input command voltage from the digital compensator 32 into a charge that can actuate the piezoelectric actuator 12. Commercially available versions of series linear drive amplifiers such as the APEX (Trademark), PA88 (Trademark) and PA89 (Trademark) have been used almost exclusively.

The smart strut piezoceramic actuator 12 has a large capacitance, on the order of $\mu$-Farads. At higher frequencies (kHz), it becomes increasingly difficult for the drive amplifier 34 to supply the current required to maintain the ceramic actuator 12 at its commanded voltage. The capacitive load induces a pole (or resonance) in the transfer function of the amplifier 34. This occurs in series with a pole in the gain curve of the amplifier 34 to produce a 180° phase shift at a critical frequency, and oscillation can occur. This oscillation has been measured, and has also been predicted analytically. A lead-lag circuit in the op-amplifier feedback is one approach used to overcome this instability. The lead-lag acts to drop the gain before the instability frequency, while at the same time including a 90° phase lead which adds to phase margin. Thus, high frequency instability problems encountered in the drive amplifier 34 have been alleviated and excellent performance up to several kHz has been demonstrated.

Exemplary Control Electronics

An implementation of the digital control electronics 13 of FIG. 5 lines and is represented in the exemplary schematic of FIG. 6. The two sensors 10 and 11 direct their respective output charge signals in parallel to the input of single charge amplifiers 29 and 30. The output voltages are sent along lines 132 to the digital compensator 32 which introduces a 90° phase lag into the electrical signal at mechanical resonance of the controlled structure.

The digital compensator 32 effectively filters and tunes the phase lagged signal via one or more software difference equations. The digital compensator 32 converts the analog voltage input from the line 132 to a digitized numerical value via an analog-to-digital converter in a microprocessor chip 133. The incoming analog signal waveform is properly amplified in voltage level to utilize the full range of the analog-to-digital converter (usually 0–5 volts). The signal must not be unduly small such that the signal falls below the resolution level of the converter. The digitized waveform is then numerically shifted in time via the microprocessor 132 executing difference equations. A numerical result of these equations is, in real time, sent to a memory location where a digital-to-analog converter changes the number to a proportional voltage to be sent to drive amplifiers 135 and 136.

Appropriate implemantation of the digital compensator 32 takes into account signal sampling rates, scaling factors, numerical truncation, and the digital noise generated. The digital compensator 32 is advantageous for certain applications due to the software tuning or programming feature which can be done remotely through an input line 137. The output of the digital-to-analog converter is typically filtered again through filter 139 to remove high frequency switching noise caused from the converter.

The outputs of the two charge amplifiers 29 and 30 are summed in the microprocessor chip 133 which constitutes the digital compensator 32. The output 134 is directed to the filter circuit 139 to smooth the pulse width modulated output of the microprocessor chip 133. From the filter 139, the signal is directed to a pair of amplifiers 135 and 136 which constitutes the drive amplifier 34 of the digital control electronics 13. The chip 133 can be programmed to vary its operation by signals from the input lines 137 which come from remotely located control electronics, such as a host computer. A suitable microprocessor chip 133 would be an Intel 80C196KC (Trademark). The chip 133 is driven by a 16 MHz clock circuit 138.

Operation of Digital Control

Figures 7A, 7B, 7C:
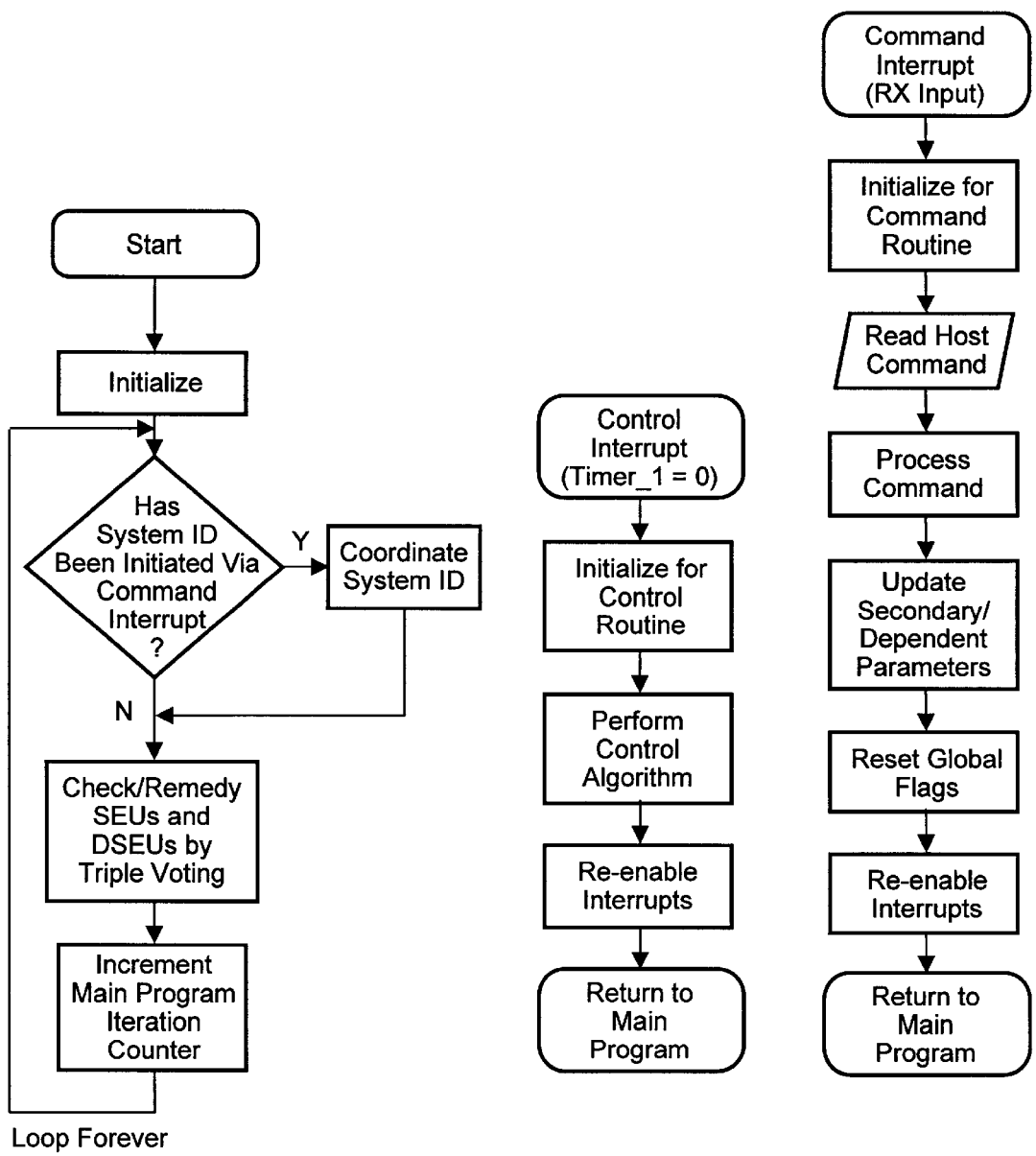
FIGS. 7a, 7b and 7c are flow diagrams illustrating the operation of the digital control electronics, and are respectively the main program, control interrupt program, and the command interrupt program.

In the operation of the digital control for the patch assembly, a sequence of procedures is depicted in the flow diagrams of FIGS. 7a, 7b and 7c which describe the operation of the microprocessor chip 133. The controller software performs all functions associated with the active damping electronics and resides in the ROM of the Intel 80C196 (Trademark) processor. The program includes a main program (FIG. 7a) and two subprograms: a control interrupt program (FIG. 7b) and a command interrupt program (FIG. 7c).

The main program is concerned with the procedure for memory housekeeping to service routines, and providing a host program for the control interrupts required for operation of the microprocessor chip 133. There is illustrated the self control characteristics as determined by a preprogrammed microprocessor chip 133, and also the loop for input signals to program the operation of the microprocessor chip 133 differently. The command interrupt program accepts host commands that redirect the microprocessor to effect damping, perform system identification, stop, or update numerical data or software. The control interrupt program is an overhead program to ensure damping implementation with the microprocessor chip 133 in relation to the nature of the input and output signals to the microprocessor. Effective scaling of the input and output signals is achieved in this interrupt program to maximize numerical ranges of the microprocessor. The control interrupt program acts to interrupt the main program and effect the filtering.

Initially, the main program is reset. This establishes the program at the commencement of its operative sequence. Thereafter, the basic blocks of the program are to initialize, namely the libraries, analog/digital convertor portion, pulse width modulator output, and serial input/output ports. At the next phase, the main program is interrupted via a clock timer and data is obtained from the operational amplifiers 29 and 30 connected to the sensors 10 and 11. This analog data is imputed on lines 132 to two serial ports of the microprocessor where it is converted into digital form (A/D). The data updates variables for a difference equation, namely the control algorithm, which is then executed. The output of the difference equation provides a number representing a signal level which is converted to an analog signal via a pulse width modulated digital to analog converter (D/A). A delay is provided since it can be undesirable to sample input data too frequently. About 40 times per second should be acceptable for a system with vibration modes below 10 Hz, whereas the microprocessor would normally operate at about 3000 cycles per second.

A. The Main Program.

The main program loops forever upon power-up until power down. At the Start, and upon power-up, the program begins executing code residing in the on-board read-only memory (ROM). The Initialize block represents complete initialization of on-chip hardware registers and controller software parameters. The System ID determines whether a system ID has been initiated via the command interrupt, then control passes to the control interrupt routine, which measures and sends transfer function data back to the host. The Coordinate System ID routine for each frequency of the system ID sine sweep, does the following:
1. Sets the control period (the period at which the control interrupt occurs) to the corresponding frequency.
2. Resets all transfer function accumulators.
3. Waits for the control interrupt to execute enough measurement cycles to accumulate a transfer function data point.
4. Sends the data point to the host.

When this is done for all frequencies, the state of the controller is restored to what it was before the system ID was initiated. Control then passes back to the main program.

A check/remedy single event upset (SEU) routine compares and votes on three data sets that are designed to have identical values. Such upsets could be caused by a radiation particle hitting the microprocessor electronic component. Multiple data sets are used to avoid the possibility of error. If there is one or more mismatches, a SEU has occurred. In the single mismatch case, the offending data is set equal to that of the other two. In the multiple mismatch case, arbitrarily, all data is set equal and appropriate error counters are incremented.

The increment iteration counter is a global variable which keeps track of the number of iterations of the main program.

B. The Control Interrupt Program.

The Control Interrupt program is the actual workhorse of the controller, namely the electronics being the charge amplifiers, compensators, and drive amplifiers. This interrupt occurs at a rate (sample frequency) specified by a global variable and performs a selected control algorithm repeatedly.

The Control Interrupt is a 16-bit, free running internal count-down timer which is the interrupt source. When the counter reaches "0" from a preset value dependent upon the sample frequency global variable, control passes to this interrupt routine.

The Initialize for Control Routine disables interrupts and the timer is reset to the aforementioned preset value for the next interrupt cycle.

The Control Algorithm step executes one of several possible algorithms, depending upon the state of a global variable. The algorithms may be a digital filter, namely difference equations, or a system ID function. In the case of a filter algorithm, the sequence of events is: (1) read sensor data via A/D, (2) execute filter control law, and (3) send calculated output value to drive amp via D/A. In the case of a system ID algorithm, the sequence of events is: (1) the next element of a sinewave is sent out to the drive amplifier, (2) sensor data is read in, and (3) the transfer function is calculated and accumulated.

The Re-enable Interrupts enables all interrupts for the next control interrupt and any command interrupts which may occur. Return to Main Program execution returns to the main program at the point from which it was interrupted.

C. The Command Interrupt.

The Command Interrupt occurs whenever the host sends a message. These messages consist of a header byte and the message body. The header byte defines an action for the controller to take. The optional body contains data the processor needs to complete the command action.

The Command Interrupt occurs upon receipt of a header byte from the host. The Initialize for Command Routine disables all interrupts. The read host command reads the remainder of the command (message body) in at this point. Each command contains a pre-defined number of bytes.

The Process Command performs a function based on the command received. In general, three sets of functions are available:
1. Global parameters are accessed and updated. These parameters are filter configurations and coefficients, scale factors and offsets, and sample frequency.
2. Telemetry is sent back. This includes state of health and parameter information.
3. A system ID is initiated. The controller is configured for a system ID (which will signal the main program). The previous filter configuration is saved.

The Update Secondary/Dependent Parameters updates any parameters which are affected by the change of the accessible global parameters. The two other data sets are also updated (consistent for SEU protection). The Reset Global Flags lets the main program know that parameters may have changed since the interrupt has occurred. Any other miscellaneous global flags are reset.

The Re-enable Interrupts enables all interrupts for the next control interrupt and any command interrupts which may occur. Return to Main Program returns execution to the main program at the point which it was interrupted.

Difference Equation—Control Algorithm

The numbers in the difference equation of the flow diagram are equivalent to the provision of an analog filter, namely they provide the 90° phase shift that effects damping in the foundation member in that the phase shift is at the resonance frequency of the structure. They may also effect a 180° phase shift which would result in noise cancellation rather than damping. Hence, where an undesired forced vibration is imparted to a structure, upon which the vibration is not on or near the resonance frequency, the 180° phase shift acts as an active noise cancellation device. The remote RS 232 standard electronic control through the control line 137 can change the difference terms or numbers, or entire difference equation. The difference terms contain variables representing previous history used to modify trends of new information. The difference equation can have different theoretical derivation forms which can be implemented. The algorithm itself can be changed. The equation is effectively a numerical low pass filter and/or high pass filter.

A typical difference equation is $$Y_n = 2.02Y_{n-1} - 1.42Y_{n-2} - 0.37Y_{n-3} + 0.087X_{n-1} + 0.063X_{n-2}$$

Figure 8:
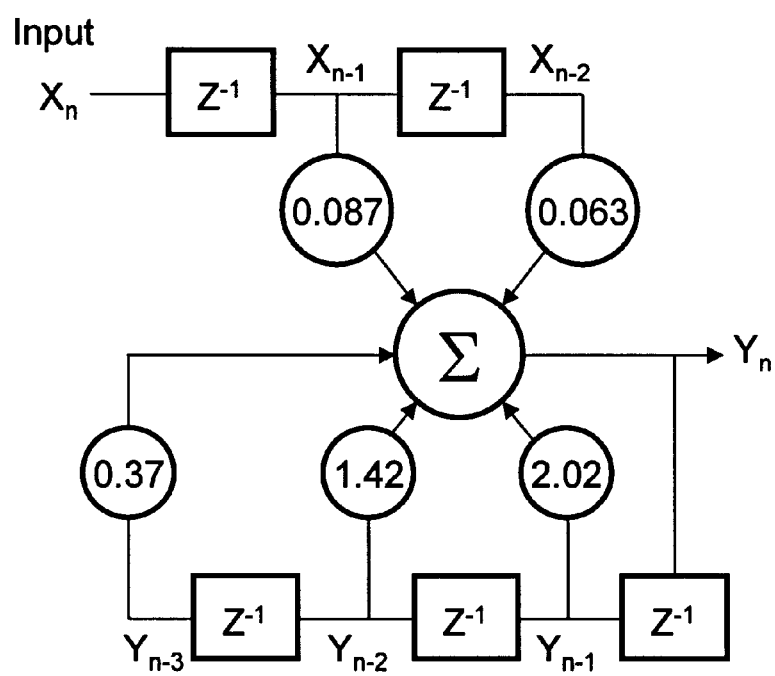
FIG. 8 is representative of a difference equation embedded in a microprocessor of the digital compensator.

This equation is also figuratively illustrated in FIG. 8. The C computer language code for the equation is:

```
While (TRUE)
  {
  y[0] = X[2] * 0.063 + X[1] * 0.087 +
     y[1] * 2.02 - y[2] * 1.42 - y[3] * 0.37;
  for (i = 3; i > 0; i --)
    {
    y[i] = y[i - 1];
    }
  X[2] = X[1]
  X[1] = X[0];
  X[0] = A_2_D;/* new input */
  put (y [0]);/* output */
  } /* end while */
```

The equation represents an output Yn for an input X. Each of the numbers "2.02", "1.42" and others represents a coefficient representative of the strut and patch characteristics. Each strut or foundation member and patch could have different coefficients.

The equation is burned into the microprocessor memory chip 133 as part of the ROM of the chip 133. The Intel (Trademark) chip being used has a 16K ROM and the entire program hosting the equation would occupy about 12K of the ROM. The chip 133 also has a 0.5K random access memory (RAM) which is programmable to vary the coefficients as necessary. The RAM is operable on a signal received by the remote electronics input on the control line 137. In other cases, different memory chips can be added having different quantities of RAM. Thus a remotely controlled electronics system can be used to operate an enlarged RAM in the chip and thereby control the microprocessor in a different manner. In such a situation, the control lines 137 can override the preprogrammed difference equation with default coefficients and a new difference equation with defaults can be inputted into the chip 133 from the RAM.

EXAMPLE

Figure 10:
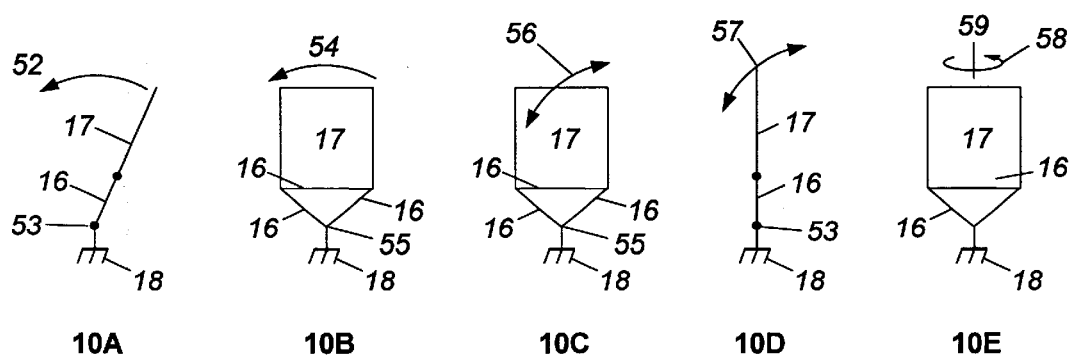
FIGS. 10a to 10e illustrate the test set ups of a spacecraft solar array with a strut as the foundation member being a smart structure for five different modes of motion.

An experimental test set-up with variable orientation and relative stiffness between components is illustrated in FIGS. 10a to 10e. In that relationship, there is shown a spacecraft solar array panel 17 which is mounted to a spacecraft body 18 through three struts 16, arranged in a triangulated format and which are actively damped. In FIG. 10a, the arrow 52 indicates a bending force about the axis 53 which is out-of-plane. In FIG. 10b, the force 54 is illustrated as a bending about axis 55 which is in-plane. In FIG. 10c, the force 56 is illustrated as a bending out-of-plane about axis 55, and in FIG. 10d, the force 57 is indicated as a bending in-plane about axis 53. In FIG. 10e, the force 58 is indicated as a torsional force about axis 59.

The following table indicates measured frequencies with and without active damping for the solar array 17.

TABLE I

MEASURED FREQUENCIES AND DAMPING FOR THE SOLAR ARRAY SETUP

|  | Bending 1 Out-of-Plane (FIG. 10a) | Bending 1 In-Plane (FIG. 10b) | Bending 2 Out-of-Plane (FIG. 10c) | Bending 2 In-Plane (FIG. 10d) | Torsion 3 (FIG. 10e) |
|---|---|---|---|---|---|
| Without $\omega$ | 0.82 Hz | 2.0 Hz | 0.93 Hz | 2.5 Hz | 3.1 Hz |
| Damping $\zeta$ | 2.1% | 4.2% | 0.79% | 0.51% | 2.0% |
| With Active $\omega$ | 0.88 Hz | — | 0.89 Hz | — | 3.2 Hz |
| Damping $\zeta$ | 11.2% | — | 7.0% | — | 2.2% |

General

As illustrated in FIG. 9, the modular control patch assembly 19 of the foundation member 33 in the smart structure is attached to a surface 36 of a structure 35. Being preformed and tested, and self-contained and furnished with digital control electronics 13, the patch unit 19 and control electronics 13 can be easily mass produced. Faults in any of the control patches 19 can easily be mitigated by removal of the electronics from the structure without impacting other structure characteristics.

The miniature control electronics 13 being discrete, and contained in a self-contained connector 113, the connector 113 is attached directly or indirectly on to the smart structure. The unit 19 can function independently or in a slave configuration to control the foundation member 33.

The mechanical/electrical attachment is an interface connector button board 14 or other connector techniques which are reliable structurally and electrically under a mechanical strain field. The electrical interface with the portions remote from the patch 19 includes the serial harness 21 that supplies electrical power and command/communication signals through the micro-miniature connector 20. The miniature structure is low in power consumption, light weight and rugged to survive hostile environments.

The apparatus and system of the invention provides for redundancy and autonomy in activated structure design. Thus, if any one or more of the modular patches assemblies 19 or the digital control electronics 13 become defective, other patches 19 effectively can control movement of the foundation member 33.

By providing modular patch 19, there is avoided the need for complex harness constructions which would otherwise be used to control the sensors 10 and 11 and actuators 12 on a strut, as illustrated in FIG. 3. The provision of the control electronics 13 locally and on-site in adjacency with each actuator 12 and sensor sets 10 and 11 provides significant advantages in that the wiring to the strut 16 is significantly simplified. Thus, each patch unit 19 has local control electronics 113 in local close physical, and optionally, integrated relationship with the control patch 19.

In some situations, two sets of actuator/sensors 10, 11, and 12 can be connected with a single control electronic system 13. The control electronics 13 are in close adjacency with the pair of actuator/sensors 10, 11 and 12 of each control patch 19.

The characteristic of having multiple actuator/sensors units 10, 11, and 12 located on the foundation member 33, each controlling a segment of the foundation member 33, provides in sum an overall control of the foundation member 33.

By having the control electronics 13 removable or added after a sensor/actuator unit control patch 19 is embedded in a PZT, there is avoided the consequence of subjecting the electronics to undue vibration, thermal cycling, thermal vacuum, and other testing or handling which could otherwise impact the integrity of the electronics. Thus, the risk of electronic failure and the ability to remove faulty electronics is considerably enhanced. A configuration where electronics are removably connected with the patch unit 19, but at the same time connected with the patches in a manner avoids complex harness and wiring connections with the actuator/sensors of each patch 19.

In different applications of the invention, multiple, and as many as several hundred, sensor/actuator patches 19 can be located on a foundation member 33. In a retrofit situation, this would be effected by affixing the patches 19 onto the surface 36 of the foundation member 33 in a manner effective to transfer strain between the foundation member 33 and the patches 19. Each of several units 19 would be separately controlled by dedicated electronics 13 for the actuator/sensor patch unit 19 thereby to control the overall motion of the foundation member 33. In some situations, the actuator/sensor patch 19 can be embedded in a procedure in a composite or bonded onto a composite or metallic structure. It can also be affixed to the outside of the foundation member 33 in a mechanically bonded manner.

In some forms of the invention, the control electronics 13 is formed integrally into a combined unit patch with the patch assembly 19. As such, the integral electronics patch 19 and 13 can be located locally as desired on the foundation member 33. Any integral unit 19 and 13 which is defective can be electronically or mechanically removed from operative interaction with the foundation member and a central electronic control.

Applications of the invention include aerospace purposes in spacecraft, aircraft, and military vehicle vibration suppression, shape control, and health monitoring. Suppression of movement in different directions, such as axial, bending and torsion can be controlled with the modular control patch 19. Forces, strains or vibrations can be imparted or damped with the control patch 19.

Other applications of the invention include structural health monitoring such as in buildings, or bridges or different planar surfaces such as the skin of wings of aircraft.

Also, the invention can be applied to retain static control of foundation members and control deformity of structures. When vibration of panels is reduced, then noise can be reduced since there is less vibration, for instance, in vehicles such as planes, and automobiles.

The modular self-contained control member which is controllable in terms of the invention provides for a reduction in weight and size of about 75% over prior art controlled members.

Many other examples of the invention exist, each differing from others in matters of detail only. The invention is to be determined solely in terms of the following claims. For instance, different combinations of sensors and actuators can be used, namely single or multiple actuators with a single or multiple sensors.

What is claimed is:

1. A control unit for controlling strain in a foundation member, the control unit comprising an assembly being a pre-formed patch containing a base, a piezoelectric sensor and a piezoelectric actuator located in operative relative relationship, means for placing the assembly in operative relationship with the foundation member whereby the sensor detects a strain in the foundation member and whereby the actuator imparts a strain-inducing force to the foundation member, means for connecting control electronics in operative relationship with the assembly, and the control electronics including a programmable digital compensator, the compensator having means for periodically storing and updating an input list of most recent input values and an output list of most recent output values, and means for determining a new output value as a weighted algebraic sum of selected ones of the input and output values of the input and output lists.

2. A control unit as claimed in claim 1 including means for locating the control electronics in physical abutment with the assembly.

3. A control unit as claimed in claim 1 wherein the control electronics is integrated with the assembly.

4. A control unit as claimed in claim 1 wherein the means for placing the assembly comprises the assembly being bonded to the foundation member.

5. A control unit as claimed in claim 1 wherein the sensor and the actuator are spaced laterally apart, and including a graphite element for at least partly encapsulating the base, the sensor and the actuator.

6. A control unit as claimed in claim 5 including access means in the graphite element for permitting connection between the control electronics and the assembly.

7. A control unit as claimed in claim 1 wherein the means for connecting the control electronics includes an interface for location between the assembly and the control electronics, the interface isolating strain in the assembly from the control electronics.

8. A device for controlling strain in a foundation member comprising an assembly being a patch containing a piezoelectric sensor and a piezoelectric actuator located in operative relative relationship, local control electronics, means for operatively connecting the local control electronics between the sensor and the actuator, means for placing the assembly in operative relationship with a foundation member whereby the sensor detects a strain in the foundation member and whereby the local control electronics processes a signal from the sensor and activates the actuator, and the actuator imparts a force to the foundation member, the local control electronics including a programmable digital compensator having means for periodically storing and updating an input list of most recent input values and an output list of most recent output values, and means for determining a new output value as a weighted algebraic sum of selected ones of the input and output values of the input and output lists.

9. A device for controlling strain in a foundation member comprising an assembly being a patch containing a piezoelectric sensor and a piezoelectric actuator located in operative relative relationship, means for placing the assembly in operative relationship with the foundation member whereby the sensor detects a strain in the foundation member and whereby the actuator imparts a selected force to the foundation member, means for connecting local control electronics in operative relationship with the assembly, further control means located remotely from the assembly and connected with the local control electronics, wherein said further control means provides at least one of power for the local control electronics and a central command communication for the local control electronics, and the local control electronics includes a programmable digital compensator having means for periodically storing and updating an input list of most recent input values and an output list of most recent output values, and means for determining a new output value as a weighted algebraic sum of selected ones of the input and output values of the input and output lists, the compensator being programmable in response to signals from the further control means.

10. A device as claimed in claim 8 wherein the local control electronics is embedded in the means for operatively connecting.

11. A foundation member comprising multiple numbers of the control unit as claimed in claim 1, the multiple numbers of the control unit each being spaced selectively about the foundation member.

12. A device as claimed in claim 8 wherein the local control electronics comprises an input stage for amplifying an analog signal from the piezoelectric sensor, an analog to digital converter responsive to the input stage, the digital compensator dynamically processing the amplified and converted signal, a digital to analog converter responsive to the compensator, and a drive amplifier for activating the piezoelectric actuator in response to the drive amplifier.

13. A device as claimed in claim 12 wherein the digital compensator applies a frequency dependent electric phase shift relative to a mechanical resonance of the foundation member thereby to provide a signal for suppressing vibrations in the foundation member through the actuator.

14. A device as claimed in claim 12 wherein the digital compensator effects filtering whereby a cutoff frequency of the digital compensator is substantially tuned to match characteristics of the foundation member.

15. A device as claimed in claim 12 including means in the digital compensator for receiving a signal for varying the operation of the compensator.

16. A device as claimed in claim 12 wherein the drive amplifier includes a lead-lag circuit, the lead-lag circuit reducing a gain of the drive amplifier at a selected frequency related to the actuator and acting to minimize high frequency amplifier oscillation at the selected frequency.

17. A method of controlling strain in a foundation member comprising locating an assembly being a pre-formed patch including a base, a piezoelectric sensor and a piezoelectric actuator coupled to the base; locating the assembly in operative relative relationship on the foundation member; and connecting control electronics in operative relationship with the assembly, whereby the sensor detects a strain in the foundation member and whereby the actuator imparts a strain-inducing force to the foundation member; and digitally programming a digital compensator in the control electronics thereby to permit control of strain in the foundation member.

18. A method as claimed in claim 17 including locating locating the control electronics in physical abutment with the assembly.

19. A method as claimed in claim 17 including integrating the control electronics with the assembly.

20. A method as claimed in claim 17 including bonding the assembly to the foundation member.

21. A method as claimed in claim 17 including laterally spacing the sensor and actuator, from the encapsulating the assembly in graphite reinforced plastic.

22. A method as claimed in claim 21 including providing an access in the graphite reinforced plastic for permitting connection between the control electrics and the assembly.

23. A method for controlling strain in a foundation member comprising the steps of providing an assembly comprising a piezoelectric sensor and a piezoelectric actuator; locating the assembly in operative relative relationship with the foundation member; connecting local control electronics between the sensor and the actuator without coupling strain between the assembly and the local control electronics, whereby when the sensor detects a strain in the foundation member the control electronics processes a signal from the sensor for the actuator, and the actuator imparts a selected force to the foundation member, and digitally programming a compensator in the control electronics for implementing a difference equation whereby sequential outputs of the compensator are weighted algebraic sums of prior inputs and outputs of the compensator, thereby to permit control of the foundation member.

24. A method for controlling strain in a foundation member comprising the steps of providing an assembly comprising a piezoelectric sensor and a piezoelectric actuator; locating the assembly in operative relative relationship with the foundation member; connecting local control electronics including a programmable digital compensator in operative relationship with the assembly; connecting a further control means located remotely from the assembly with the local control electronics, wherein said further control means provides at least one of power for the local control electronics and a central command communication for the local control electronics; digitally programming the digital compensator whereby, when the sensor detects a strain in the foundation member, the actuator imparts a strain-inducing force to the foundation member; and further digitally programming the digital compensator in the local control electronics by signals from the further control means thereby to permit alterable control of the foundation member.

25. A method as claimed in claim 23 wherein the control electronics amplifies an analog signal from the piezoelectric sensor, digitally compensates the amplified signal using the difference equation, amplifies the compensated signal, and activates the piezoelectric actuator.

26. A unit as claimed in claim 1 including the control electronics being fastened to the assembly by a strain-forgiving interface.

27. A unit as claimed in claim 1 wherein the digital compensator effects filtering whereby a cutoff frequency of the digital compensator is substantially tuned to match characteristics of the foundation member.

28. A unit as claimed in claim 1 including means in the digital compensator for receiving a signal for varying operation of the compensator.

29. A method as claimed in claim 17 including fastening the control electronics to the assembly without coupling strain between the assembly and the control electronics.

30. A control unit as claimed in claim 1, wherein the means for placing the assembly comprises the assembly being imbedded in the foundation member.

31. A foundation member comprising a control unit as claimed in claim 1.

32. A control unit as claimed in claim 2 wherein the means for locating the control electronics in physical abutment with the assembly comprises a strain-forgiving interface connection.

33. A control unit as claimed in claim 8 wherein the assembly is a pre-formed patch.

34. A foundation member comprising multiple numbers of the device as claimed in claim 8, the multiple numbers of the device each being spaced selectively about the foundation member.

35. A control unit as claimed in claim 12 wherein the digital compensator applies a frequency dependent numeric gain relative to a mechanical resonance of a foundation member thereby to provide an output for suppressing vibrations of the foundation member through the actuator.

36. A control unit as claimed in claim 12 wherein the digital compensator means applies a frequency dependent combination of electric gain and phase shift relative to a mechanical resonance of a foundation member thereby to provide a signal for suppressing vibrations of the foundation member through the actuator.

37. A method as claimed in claim 17 including embedding the assembly within the foundation member.

38. A control unit for controlling strain in a foundation member, the control unit comprising an assembly being a pre-formed patch containing a base, a piezoelectric first sensor and a plurality of piezoelectric actuators located in operative relative relationship, the actuators being located in a string array and fixedly located on the base, means for placing the assembly in operative relationship with the foundation member whereby the sensor detects a strain in the foundation member and whereby the actuators imparts a strain-inducing force to the foundation member, means for connecting control electronics in operative relationship with the assembly, and the control electronics including a programmable digital compensator, the compensator having means for periodically storing and updating an input list of most recent input values and an output list of most recent output values, and means for determining a new output value as a weighted algebraic sum of selected ones of the input and output values of the input and output lists; an intermediate encapsulation layer having cavities for the actuators, the intermediate encapsulation layer being fixedly located on the base and the actuators, the first sensor being fixedly located on the intermediate encapsulation layer in co-located relation with the string array of actuators; a second piezoelectric sensor fixedly located on the intermediate encapsulation layer and spaced laterally in nearly-collocated relation with the string array; an outer encapsulation layer having cavities for the sensors, the outer encapsulation layer being fixedly located on the intermediate encapsulation layer and the sensors; and a graphite tape overwrap affixed to the outer encapsulation layer.

* * * * *